(12) United States Patent
Yung

(10) Patent No.: US 6,839,298 B2
(45) Date of Patent: *Jan. 4, 2005

(54) ZERO STATIC POWER FUSE CELL FOR INTEGRATED CIRCUITS

(75) Inventor: Ma Fan Yung, Singapore (SG)

(73) Assignee: Infineon Technologies Aktiengesellschaft, Munich (DE)

( * ) Notice: Subject to any disclaimer, the term of this patent is extended or adjusted under 35 U.S.C. 154(b) by 513 days.

This patent is subject to a terminal disclaimer.

(21) Appl. No.: 10/042,702

(22) Filed: Jul. 11, 2001

(65) Prior Publication Data

US 2003/0011953 A1 Jan. 16, 2003

(51) Int. Cl.[7] .............................................. G11C 7/00
(52) U.S. Cl. ............................. 365/225.7; 365/189.05; 365/189.08
(58) Field of Search ........................ 365/225.7, 189.05, 365/189.08, 194

(56) References Cited

U.S. PATENT DOCUMENTS

| | | | |
|---|---|---|---|
| 4,532,607 A | 7/1985 | Uchida | |
| 4,546,455 A | 10/1985 | Iwahashi et al. | |
| 4,922,134 A | 5/1990 | Hoffmann et al. | |
| 5,047,664 A | 9/1991 | Moyal | |
| 5,315,177 A | 5/1994 | Zagar et al. | |
| 5,345,110 A | 9/1994 | Renfro et al. | |
| 5,731,734 A | 3/1998 | Pathak et al. | |
| 5,929,691 A | 7/1999 | Kim et al. | |
| 6,021,067 A | 2/2000 | Ha | |
| 6,087,890 A | 7/2000 | Kim | |
| 6,201,750 B1 | 3/2001 | Busch et al. | |
| 6,215,351 B1 | 4/2001 | Le et al. | |
| 6,236,599 B1 | 5/2001 | Goto | |
| 6,256,239 B1 | 7/2001 | Akita et al. | |
| 6,281,739 B1 | 8/2001 | Matsui | |
| 6,404,680 B1 | 6/2002 | Kwon | |
| 6,590,825 B2 * | 7/2003 | Tran et al. ............... 365/225.7 |
| 6,603,344 B2 * | 8/2003 | Yung ......................... 327/525 |
| 6,693,481 B1 * | 2/2004 | Zheng ........................ 327/525 |
| 2003/0011953 A1 * | 1/2003 | Yung ......................... 361/104 |
| 2003/0185081 A1 * | 10/2003 | Ma ........................... 365/225.7 |
| 2003/0189457 A1 * | 10/2003 | Ma ............................ 327/525 |

FOREIGN PATENT DOCUMENTS

| | | |
|---|---|---|
| EP | 0 528 744 A3 | 2/1993 |
| EP | 0 528 744 A2 | 2/1993 |
| EP | 0 947 993 A2 | 10/1999 |
| EP | 0 947 993 A3 | 6/2000 |
| JP | 68105497 | 6/1983 |
| JP | 2000021191 | 1/2000 |

OTHER PUBLICATIONS

"DC CMOS Fuse True/Complement Generator"; IBM Technical Disclosure Bulletin; vol. 30; No.: 12: May 1988; p. 51.

Kokkonen et al., "Redundancy Techniques for Fast Static RAMs", 1981 IEEE International Solid–State Circuits Conference, Feb. 18, 1981, p. 80–81.

* cited by examiner

Primary Examiner—Richard Elms
Assistant Examiner—Hien Nguyen
(74) Attorney, Agent, or Firm—Horizon IP Pte Ltd

(57) ABSTRACT

A fuse cell with reduced or no static power dissipation is disclosed. The fuse cell utilizes a latch to store the state of the fuse. The use of the latch avoids having a pull-up power source being coupled to ground when the fuse is uncut as with conventional fuse cells.

18 Claims, 5 Drawing Sheets

101

201

ZERO STATIC POWER FUSE CELL FOR INTEGRATED CIRCUITS

FIELD OF THE INVENTION

The present invention relates generally to integrated circuits (ICs). More particularly, the invention relates to fuses used in ICs.

BACKGROUND OF THE INVENTION

Fuse cells are widely used in integrated circuits. As an example, fuse cells can be used to store addressing information of defective memory cells in an array for redundancy applications. FIG. 1 shows a conventional fuse cell 101 comprising a pull-up circuit. As shown, a fuse 110 is coupled between the pull-up (logic 1 or high) power source and ground (logic 0 or low). Coupled between the fuse and the pull-up power source is a fuse cell output terminal 160. The output signal of the fuse cell indicates the state of the fuse (cut or uncut). A cut fuse produces a logic 1 output while an uncut fuse produces a logic 0 output.

When the fuse is not cut, the pull-up power source is coupled to ground via the fuse. Thus, even when the fuse is in a static state, power dissipates through the fuse which increases the IC's power consumption. The increased power consumption is undesirable, particularly for low power applications.

As evidenced from the above discussion, it is desirable to provide an improved fuse cell with reduced or no static power dissipation.

SUMMARY OF THE INVENTION

The invention relates generally to fuse cells. In particular, the invention relates to a fuse cell having reduced or no static power consumption. In one embodiment, the fuse cell includes a control circuit, a fuse circuit, an initialization circuit and a latch. The control circuit is coupled to the latch, fuse circuit and initialization circuit. In response to an active initialization signal, the control circuit couples the latch to the initialization circuit. The initialization circuit sets the latch to a first state. After fuse cell is initialized, the initialization signal is deactivated which causes the fuse cell to operate in the normal operating mode. In the normal operating mode, the initialization circuit is decoupled from the latch while the fuse circuit is coupled to the latch. Depending on the fuse state, the latch remains in the first state or is switched to a second logic state.

PREFERRED EMBODIMENTS OF THE INVENTION

Figure 1:
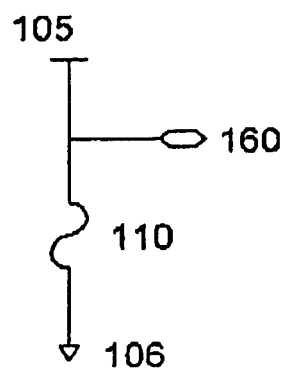
FIG. 1 shows a conventional fuse cell.
Figure 2:
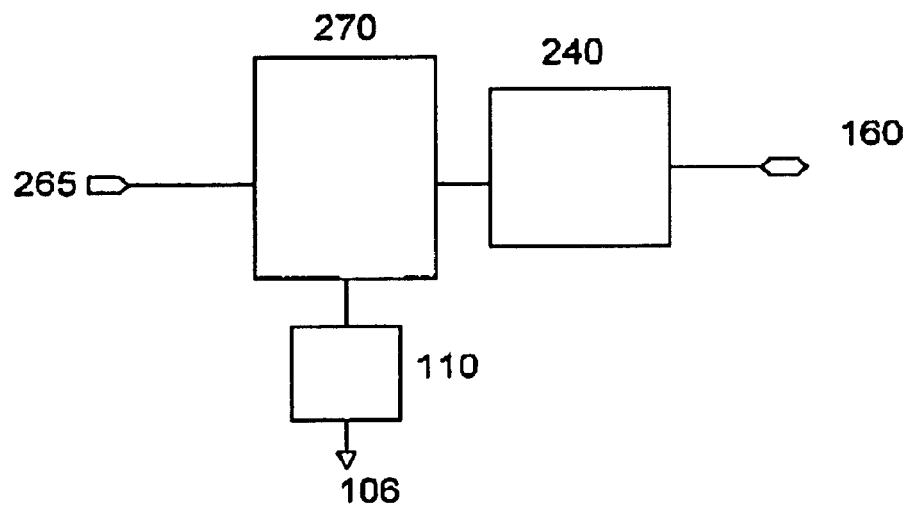
FIGS. 2–6 show fuse cells in accordance with various embodiments of the invention.

FIG. 2 shows a block diagram of a fuse cell 201 having reduced or no static power dissipation. In accordance with the invention, static power dissipation is avoided or reduced by using a latch 240, which is coupled to a fuse 210, to store or generate information related to the state of the fuse. The information is provided at a fuse cell output terminal 160 coupled to the latch. A control circuit 270 is coupled to the fuse and the latch. The control circuit includes an input terminal 265 for receiving a fuse reset or control signal to initialize the fuse.

To initialize the fuse cell, an active init signal is provided at the input terminal. In one embodiment, the active init signal comprises an active low (logic 0) signal. The init signal, for example, can be the power on reset signal. During initialization, the latch is decoupled from the fuse and set to a known state or logic level (first state). The init signal is then inactivated (e.g., logic 1) after initialization is completed. Inactivating the init signal couples the latch to the fuse. Depending on the whether the fuse is cut or uncut, the latch remains at the first state or is flipped to the second state.

In one embodiment, the latch is initialized to store a logic 1, producing a logic 1 output. A cut fuse does not affect the state of the latch (or the fuse cell output) while an uncut fuse causes the latch state to switch from a logic 1 to a logic 0. The switch in logic level in the case of an uncut fuse is due to the fact that the fuse is coupled to ground. By using the latch, the present invention avoids having a pull-up power source being connected to ground when the fuse is uncut, as in the case of conventional fuse cell, thereby reducing or eliminating static power dissipation.

Figure 3:
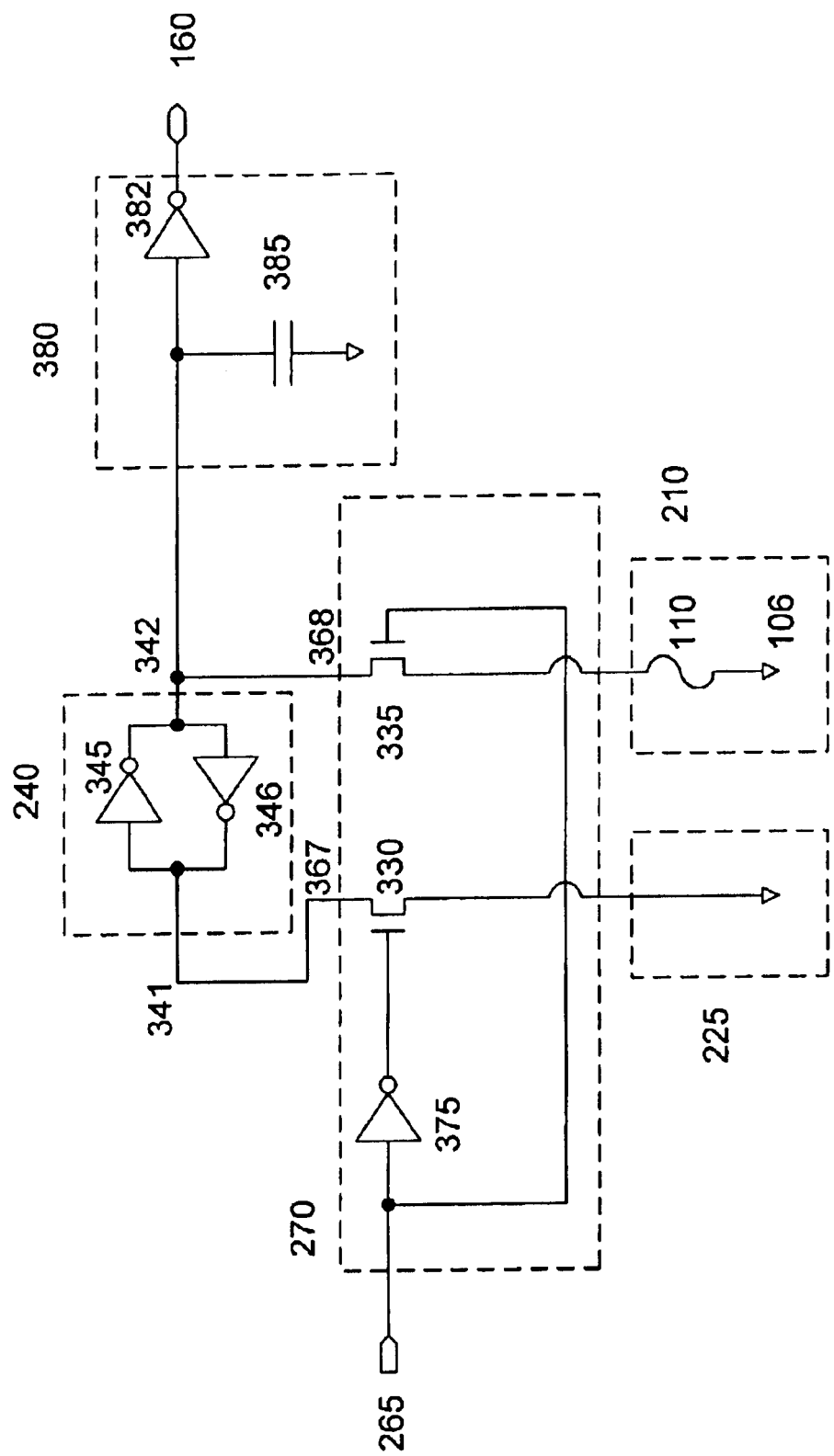

Referring to FIG. 3, a fuse cell in accordance with one embodiment of the invention is shown. The fuse cell comprises a control circuit 270, a latch 240, an initialization circuit 225, and a fuse circuit 210. The latch includes first and second terminals 341 and 342 which are commonly coupled to first and second inverters 345 and 346 back-to-back. The first and second latch terminals are coupled to output terminals 367 and 368 of the control circuit.

In one embodiment, the control comprises first and second transistors 330 and 335. The transistors, for example, are n-FETs. First and second terminals of the first transistor are coupled to the first terminal of the latch and the initialization circuit. In one embodiment, the initialization circuit comprises a pull-down power source such as ground. The second transistor's first and second terminals are coupled to the second terminal of the latch and the fuse circuit. In one embodiment, the fuse circuit comprises a fuse 110 coupled to ground 106. The gates of the transistors are coupled to the input terminal of the control circuit or through an inverter. The first and second transistors operate in a push-pull configuration. That is, one transistor is on (conductive) while the other is off (non-conductive). In one embodiment, an inverter 375 is located between the input terminal and the first transistor, causing the n-FETs to operate in a push-pull configuration.

The fuse cell is initialized by providing an active low input signal. The active low signal switches the first transistor on and the second transistor off, coupling the first terminal of the latch to the initialization circuit and decoupling the second terminal of the latch from the fuse circuit. This causes the latch to be initialized to a logic 1 state (i.e., first latch terminal is low while the second latch terminal is high). After the latch is initialized, the input signal is inactivated (logic 1) to decouple the first terminal of the latch from ground and to couple the second terminal of the latch to the fuse circuit. If the fuse is cut; the latch remains unchanged. An uncut fuse causes the second terminal of the latch to be coupled to ground via the fuse, switching the state of the latch from a logic 1 to a logic 0.

Figure 4:
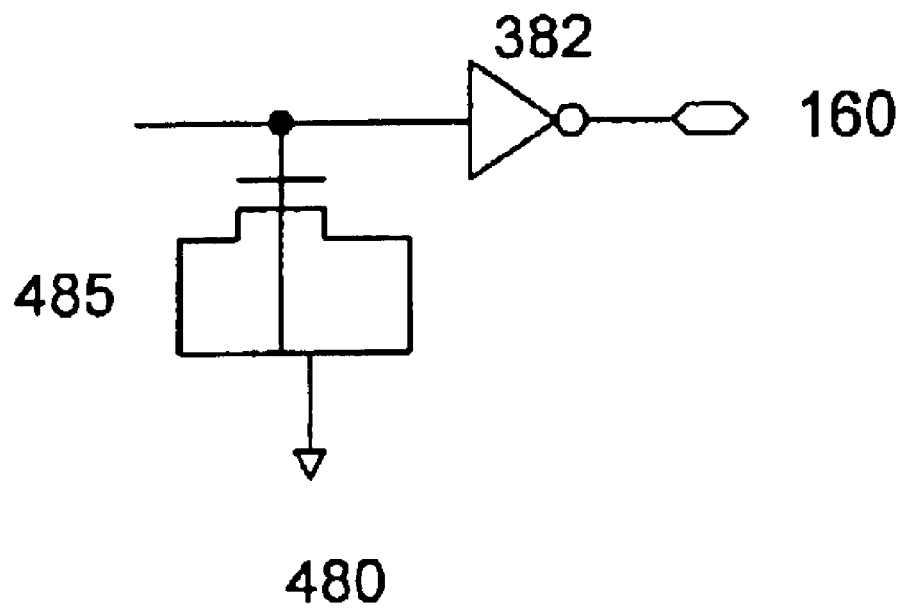

In one embodiment, an output stage 380 is coupled between the second terminal of the latch and fuse cell output terminal. The output stage comprises a capacitor 385 coupled between the output terminal and ground. In an alternative embodiment, as shown in FIG. 4, the output stage 480 comprises a CMOS capacitor 485 such as a p-FET. The capacitor serves to stabilize the fuse cell output from glitches. An inverter 382 may optionally be provided to switch the logic of the fuse cell output signal.

Figure 5:
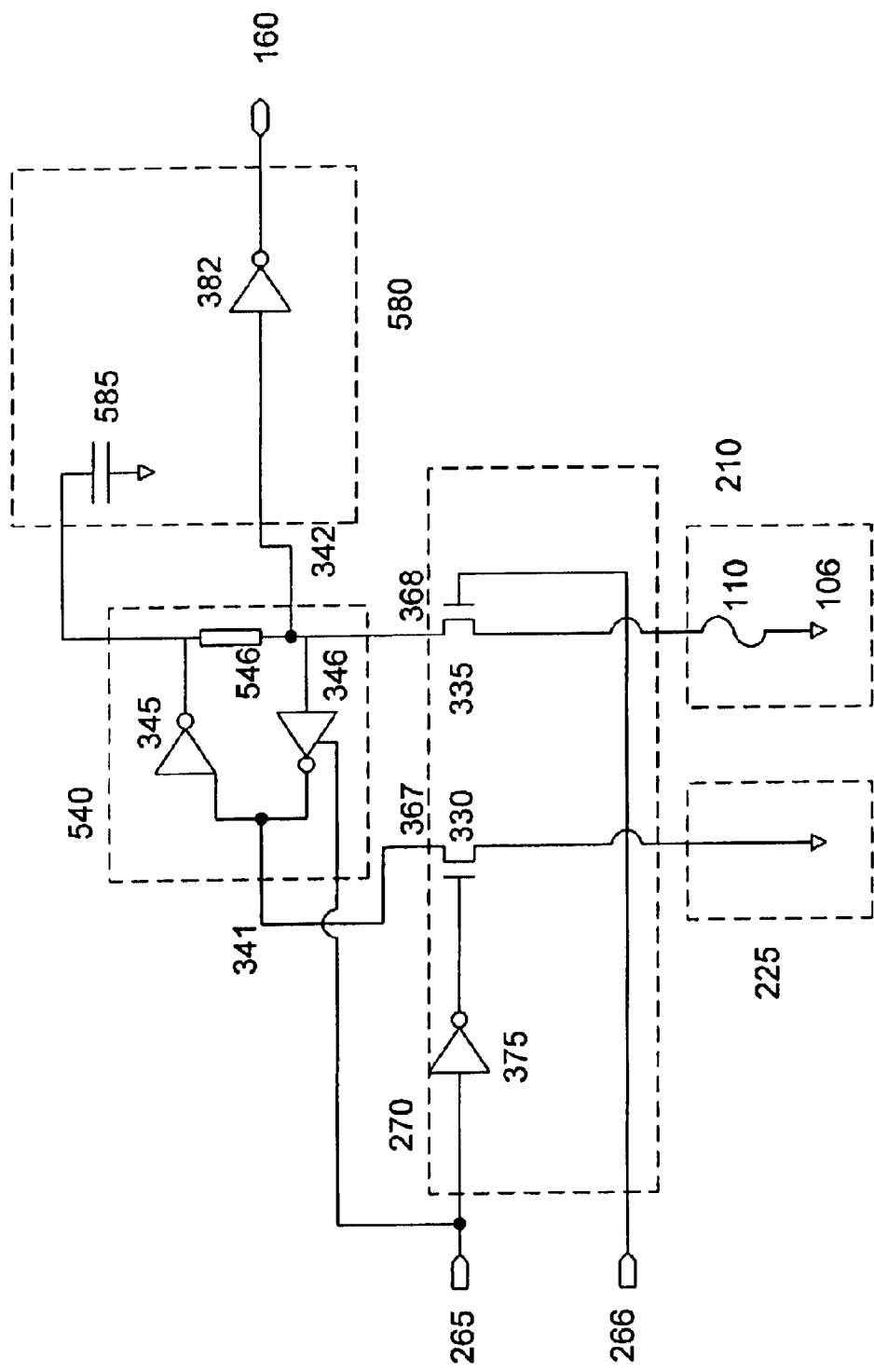
Figure 6:
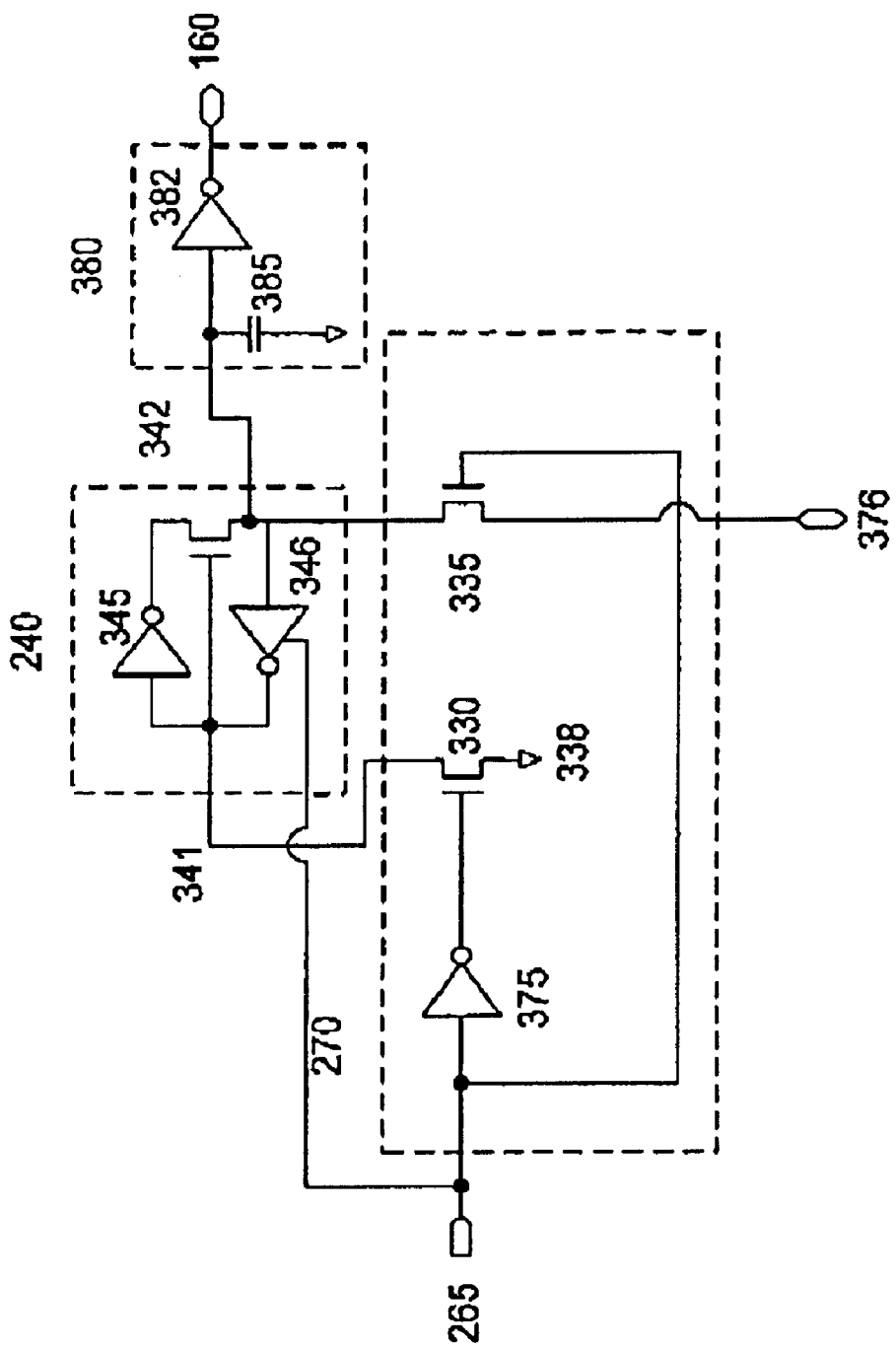

FIG. 5 shows a fuse cell in accordance with another embodiment of the invention. The fuse cell, as shown, provides a valid fuse state during initialization. This is particularly useful for applications which require a valid fuse output during power-up (e.g., power supply under-voltage detection applications). The fuse cell comprises a latch 540, a control circuit 270, an initialization circuit 225, and a fuse circuit 210. To enable a valid fuse output signal even during power up, the control circuit couples the fuse to the latch at least from the time the IC is powered up. This enables a valid fuse cell output even during initialization. A resistor 546 is provided between the output of the first latch inverter and power source 106 of the fuse to reduce power dissipation during initialization if the fuse is uncut. Alternatively, a transistor 646, such as a p-FET, as shown in FIG. 6 can serve as a resistive element.

In one embodiment, the latch includes first and second terminals 341 and 342 which are commonly coupled to first and second inverters 345 and 346 back-to-back. A resistor 546 is also commonly coupled to the inverters (e.g., output terminal of the first inverter and input terminal of the second inverter) and the second latch terminal.

The first and second latch terminals are coupled to output terminals 367 and 368 of the control circuit. The control circuit comprises first and second transistors 330 and 335. The transistors, for example, are n-FETs. First and second terminals of the first transistor are coupled to the first terminal of the latch and the initialization circuit. The second transistor's first and second terminals are coupled to the second terminal of the latch and the fuse circuit.

The first transistor and the second inverter of the latch operate in a push-pull configuration. That is, when one is on, the other is off. In one embodiment, the second latch inverter and the first transistor are controlled by the input signal at the input terminal 265 of the control circuit (init signal). In one embodiment, the second inverter is coupled to the input terminal while an inverter 375 is located between the input terminal and the gate of the first transistor, causing the first transistor and the inverter to operate in a push-pull configuration. The second transistor is controlled by inverted input signal, which is used to control the first transistor.

The fuse cell is initialized by providing an active low input signal, for example, an init signal during power up. The active low signal switches the first transistor on and the second inverter off, coupling the first terminal of the latch to the logic 0 power source. At the same time, an active signal (logic 1) is provided at input terminal 266 to switch on the second transistor in order to couple the latch to the fuse. By switching off the second inverter during initialization, the second terminal 342 is decoupled from the first terminal 341 to avoid conflict between the first and second latch terminals caused by an uncut fuse.

The logic 0 power source causes the latch to produce a logic 1 signal at the output of inverter 345. Since the fuse is coupled to this point via the resistor, a valid fuse cell output is provided at the second terminal 342 during initialization. If the fuse is cut, the fuse output is a logic 1, otherwise the fuse output is a logic 0.

After initialization phase is completed, the init signal is inactivated while the control signal at input terminal 266 remains active. This decouples the logic 0 power source from the latch and activates the second inverter. An optional output stage, as described in FIGS. 3 and 4, may be provided between the second terminal of the latch and the fuse cell output terminal. Alternatively, as shown in FIG. 5, one terminal of capacitor 585 of the output stage 580 is commonly coupled to the resistor and first inverter of the latch while the other terminal is coupled to ground.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A fuse cell comprising:

an input terminal for receiving an input signal;

an output terminal;

a control circuit coupled to the input terminal;

an initialization circuit coupled to the control circuit;

a fuse circuit coupled to the control circuit, the fuse circuit comprises a fuse having an uncut or a cut fuse state;

a latch coupled to the output terminal and the control circuit, the latch stores information indicative of the fuse state; and in response to an input signal at the input terminal, the control circuit causes the fuse cell to operate in an initialization mode by coupling the initialization circuit to the latch or to operate in a normal mode by coupling the fuse circuit to the latch, wherein the latch, depending on the state of the fuse, remains in a first state or switches to a second state.

2. A fuse cell comprising:

an input terminal for receiving an input signal;

an output terminal for generating an output signal;

a control circuit coupled to the input terminal;

a latch coupled to the output terminal and the control circuit, the latch having first and second latch states;

an initialization circuit coupled to the control circuit, the initialization circuit initializes the latch to the first latch state when activated;

a fuse circuit coupled to the control circuit, the fuse circuit comprises a fuse having an uncut or a cut fuse state; and in response to an input signal at the input terminal, the control circuit causes the fuse cell to operate in either an initialization mode or a normal mode, wherein in the normal mode, the latch is either in a first or a second latch state depending on the fuse state, causing the output signal at the output terminal to be in a first or a second output signal state to indicate the fuse state.

3. The fuse cell of claim 2 further comprises an output stage coupled to the latch and the output terminal, the output stage stabilizes the output signal.

4. The fuse cell of claim 3 wherein the initialization circuit comprises an initialization reference voltage.

5. The fuse cell of claim 4 wherein the fuse circuit comprises a fuse having first and second terminals, the first terminal coupled to the control circuit and the second terminal coupled to a fuse reference voltage.

6. The fuse cell of claim 4 wherein:

the fuse circuit comprises a fuse having first and second terminals, the first terminal coupled to the control circuit and the second terminal coupled to a fuse reference voltage, and the fuse reference voltage and the initialization reference voltage are equal to about ground.

7. The fuse cell of claim 3 wherein the fuse circuit comprises a fuse having first and second terminals, the first terminal coupled to the control circuit and the second terminal coupled to a fuse reference voltage.

8. The fuse cell of claim 2 wherein the initialization circuit comprises an initialization reference voltage.

9. The fuse cell of claim 8 wherein the fuse circuit comprises a fuse having first and second terminals, the first terminal coupled to the control circuit and the second terminal coupled to a fuse reference voltage.

10. The fuse cell of claim 8 wherein:

the fuse circuit comprises a fuse having first and second terminals, the first terminal coupled to the control circuit and the second terminal coupled to a fuse reference voltage, and the fuse reference voltage and the initialization reference voltage are equal to about ground.

11. The fuse cell of claim 2 wherein the fuse circuit comprises a fuse having first and second terminals, the first terminal coupled to the control circuit and the second terminal coupled to a fuse reference voltage.

12. The fuse cell of claim 2 wherein the control circuit comprises a fuse switch for selectively coupling or decoupling the fuse circuit to the latch in the normal mode or in the initialization mode.

13. The fuse cell of claim 12 wherein the control circuit comprises an initialization switch, the initialization switch selectively coupling or decoupling the initialization circuit to the latch in the initialization mode or in the normal mode.

14. The fuse cell of claim 13 wherein the initialization switch and the fuse switch operate in a push-pull configuration.

15. The fuse cell of claim 13 wherein at least one of the initialization switch or fuse switch comprises a transistor and the initialization switch and fuse switch operate in a push-pull configuration.

16. The fuse cell of claim 12 wherein the fuse switch comprises a transistor.

17. The fuse cell of claim 2 wherein the control circuit comprises an initialization switch, the initialization switch selectively coupling or decoupling the initialization circuit to the latch in the initialization mode or in the normal made.

18. A fuse cell comprising:

an input terminal for receiving an input signal;

an output terminal for generating an output signal;

a control circuit coupled to the input terminal;

a latch coupled to the output terminal and the control circuit, the latch having first and second latch states;

a fuse circuit coupled to the control circuit, the fuse circuit comprises a fuse having an uncut or a cut fuse state; and in response to an input signal at the input terminal, the control circuit causes the fuse cell to operate in either an initialization mode or a normal mode, wherein in the normal mode, the latch is either in a first or a second latch state depending on the fuse state, causing the output signal at the output terminal to be in a first or a second output signal state to indicate the fuse state.

\* \* \* \* \*

UNITED STATES PATENT AND TRADEMARK OFFICE
CERTIFICATE OF CORRECTION

PATENT NO. : 6,839,298 B2  Page 1 of 1
APPLICATION NO. : 10/042702
DATED : January 4, 2005
INVENTOR(S) : Fan Yung Ma It is certified that error appears in the above-identified patent and that said Letters Patent is hereby corrected as shown below:

In Item (12) - Replaced "Yung" with -- MA --

In Item (56) - Replaced "JP 68105497" with -- JP 58105497 --

Signed and Sealed this

Fourteenth Day of November, 2006

JON W. DUDAS
*Director of the United States Patent and Trademark Office*